United States Patent [19]

Bentley et al.

[11] Patent Number: 4,554,236

[45] Date of Patent: Nov. 19, 1985

[54] AMINO ACID STABILIZERS FOR WATER SOLUBLE DIAZONIUM COMPOUND CONDENSATION PRODUCTS

[75] Inventors: Trisha Bentley, Somerville; John E. Walls, Hampton; Major S. Dhillon, Somerville, all of N.J.

[73] Assignee: American Hoechst Corporation, Somerville, N.J.

[21] Appl. No.: 543,566

[22] Filed: Oct. 19, 1983

Related U.S. Application Data

[63] Continuation-in-part of Ser. No. 359,456, Mar. 18, 1982, abandoned.

[51] Int. Cl.[4] .......................... G03C 1/60; G03C 1/94
[52] U.S. Cl. .................................. 430/157; 430/171; 430/175; 430/176; 430/179; 430/158
[58] Field of Search ............... 430/179, 175, 174, 171, 430/157, 28, 176

[56] References Cited

U.S. PATENT DOCUMENTS

| | | |
|---|---|---|
| 3,199,982 | 8/1965 | Kashiwabara ...................... 430/179 |
| 3,658,537 | 4/1972 | Cradner et al. ..................... 430/552 |
| 3,704,129 | 11/1972 | de Boer et al. ..................... 430/179 |
| 3,915,707 | 10/1975 | Gesswein et al. ..................... 430/28 |
| 4,155,762 | 5/1979 | Matsuda et al. ................... 430/149 |
| 4,175,160 | 11/1979 | Vanderpool .......................... 430/28 |
| 4,268,594 | 5/1981 | Gesswein et al. ..................... 430/28 |
| 4,273,863 | 6/1981 | Deabriges et al. ................. 430/467 |

OTHER PUBLICATIONS

74 Chemical Abstract 149244u (1971).
74 Chemical Abstracts 65521s (1974).

*Primary Examiner*—Charles L. Bowers, Jr.
*Attorney, Agent, or Firm*—Richard S. Roberts

[57] ABSTRACT

This invention relates to light sensitive water soluble diazonium compound condensation products stabilized against degradation caused by heat and/or prolonged storage employing selected amino acids as stabilizers. The invention also relates to presensitized reproduction materials comprising the amino acid stabilized water soluble diazonium compound condensation products.

14 Claims, No Drawings

AMINO ACID STABILIZERS FOR WATER SOLUBLE DIAZONIUM COMPOUND CONDENSATION PRODUCTS

This application is a continuation-in-part of application Ser. No. 06/359,456, Mar. 18, 1982, abandoned.

BACKGROUND OF THE INVENTION

The present invention relates to stabilizers for light sensitive water soluble diazonium compounds and to presensitized reproduction materials such as lithographic plates having improved stability against the action of heat and/or moisture.

Presensitized reproduction materials such as used for planographic printing processes generally comprise a plate base or support member having a subbase coating or layer, over which is applied a photosensitive coating composition. The plate base may be a flexible sheet such as paper, plastic or metal which is treated to provide a hydrophilic or otherwise prepared surface upon which a photosensitive coating will adhere. In the case of metal plates, aluminum sheeting is most commonly employed as the base material having a grained or etched surface and/or a subbase formed by silica based coatings or by anodization of the aluminum in acidic electrolytic baths.

Diazonium compounds most commonly employed in the preparation of light sensitive compositions suitable for lithographic plate applications or photoresist applications may be characterized by the generic structure $A-N_2^+X^-$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid condensation medium with active carbonyl compounds such as formaldehyde, as disclosed for example in U.S. Pat. Nos. 2,063,631 and 2,667,415.

More recently, improved diazonium materials within the above generic formula have been developed which are faster, more adherable to support materials and exhibit lessened sensitivity to moisture. These include the reaction products having the composition of Formula I.

FORMULA I: At least one diazonium salt having the structure:

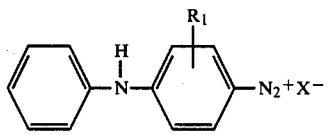

wherein $R_1$ is selected from the group consisting of
—H, an alkoxy group having from 1 to 4 carbon atoms, and a 2-hydroxy-ethoxy group, and $X^-$ is the anion of the diazonium salt,
condensed with:
at least one compound of the general formula

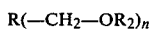
$R(-CH_2-OR_2)_n$ wherein n is an integer from 1 to 4, R is a residue produced by the splitting off of n hydrogen atoms from a diphenyl ether, and $R_2$ is an alkyl group with 1 to 4 carbon atoms, said condensation product containing, on the average, 0.25 to 0.75 unit derived from $R(-CH_2-OR_2)_n$ per diazo group.

Such materials are disclosed in U.S. Pat. No. 3,679,419, incorporated herein by reference.

Other diazonium compounds include the polycondensation products having the composition of Formula II.

FORMULA II: At least one $A-N_2^+X^-$ compound condensed with at least one compound of the formula

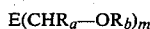
$E(CHR_a-OR_b)_m$ in which $A-N_2X$ is a radical of a compound selected from the group consisting of a compound of the formula

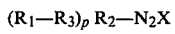
$(R_1-R_3)_p R_2-N_2X$ and

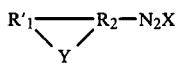

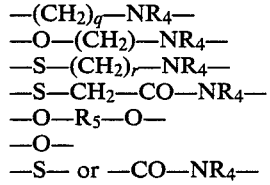

wherein
$R_1$ is an aryl group of the benzene or napthalene series
$R'_1$ is an arylene group of the benzene or napthalene series
$R_2$ is a phenylene group
$R_3$ is a single bond or one of the groups
—$(CH_2)_q$—$NR_4$—
—O—$(CH_2)$—$NR_4$—
—S—$(CH_2)_r$—$NR_4$—
—S—$CH_2$—CO—$NR_4$—
—O—$R_5$—O—
—O—
—S— or —CO—$NR_4$—
the left-hand free valence of the specified groups is attached to $R_1$ and the right-hand valence is attached to $R_2$ wherein
q is a number from 0 to 5
r is a number from 2 to 5
$R_4$ is selected from the group consisting of hydrogen, alkyl with 1 to 5 carbon atoms, aralkyl with 7 to 12 carbon atoms, and aryl with 6 to 12 carbon atoms,
$R_5$ is an arylene group having 6 to 12 carbon atoms
Y is one of the groups —NH—, and —O—
X is an anion
P is a number from 1 to 3
E is a residue obtained by splitting off m H atoms from a compound free of diazonium groups selected from the group consisting of aromatic amines, phenols, thiophenols, phenol ethers, aromatic thioethers, aromatic hetercyclic compounds, aromatic hydrocarbons and organic acid amines,
$R_a$ is selected from the group consisting of hydrogen and phenyl,
$R_b$ is selected from the group consisting of hydrogen and alkyl and acyl groups having 1 to 4 carbon atoms, and a phenyl group, and
m is an integer from 1 to 10,
are reacted in a strongly acid condensation medium and under condensation conditions sufficient to produce a polycondensation product of an aromatic diazonium compound containing, on the average, about 0.1 to 50 $B_1$ units per unit of $A-N_2X$.

Still another diazonium materials include those materials having repeating units of the composition of Formula III.

FORMULA III: At least one A—N₂⁺X⁻ compound condensed with at least one compound of the structure B, comprising repeating units of each of the general types A—N₂X and B which are linked by methylene groups, in which A—N₂X is a radical of a compound of one of the general formulae

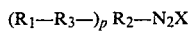

and

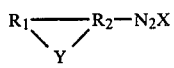

wherein
R₁ is an arylene group of the benzene or naphthalene series
R₂ is a phenylene group
R₃ is a single bond or one of the groups
—(CH₂)$_q$—NR₄—
—O—(CH₂)$_r$—NR₄—
—S—(CH₂)$_r$—NR₄—
—S—(CH₂)$_r$—CO—NR₄—
—O—R₅—O—
—O—
—S— or
—CO—NR₄—
the left-hand free valence of the specified groups is attached to R₁ and the right-hand free valence is attached to R₂ wherein
q is a number from 0 to 5
r is a number from 2 to 5
R₄ is selected from the group consisting of hydrogen, alkyl with 1 to 5 carbon atoms, aralkyl with 7 to 12 carbon atoms, and aryl with 6 to 12 carbon atoms,
R₅ is an arylene group having 6 to 12 carbon atoms
—Y— is one of the groups —NH—, and —O—,
X is the anion of the diazonium compound, and
p is a number from 1 to 3, and
B is a radical of a compound selected from the group consisting of aromatic amines, phenols, thiophenols, phenol ethers, aromatic thioethers, aromatic hetercyclic compounds, aromatic hydrocarbons and organic acid amides, in which the aromatic nuclei are unsubstituted or substituted by at least one substituent activating condensation and selected from the group consisting of —NR₇R₈, —N(R₈)₂, —OR₇, —OR₈, —R₈, and —SR₈,
wherein
R₇ is —H, —CO-alkyl, —CO-aryl, —SO₂-alkyl, —SO₂-aryl, —COHN₂, or —CSNH₂, and
R₈ is -H, -alkyl, -aryl or -aralkyl, the alkyl groups having 1 to 10, the aryl groups 6 to 20 and the aralkyl groups 7 to 20 carbon atoms,
which diazonium compound contains, on the average, about 0.01 to 50 B units per unit of A—N₂X.

Yet another category of extremely fast light sensitive diazos are those disclosed in copending application Ser. No. 359,335, filed in the U.S. Patent Office on Mar. 18, 1982, which is a continuation-in-part of Ser. No. 06/245,837, filed in the U.S. Patent Office on Mar. 20, 1981 now U.S. Pat. No. 4,436,804, issued Mar. 13, 1984. These materials may be characterized by the composition of Formula IV.

FORMULA IV: The condensation product of oligomers having the structure:

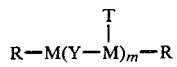

wherein:
R is selected from the group consisting of

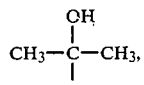

—CH₂OH, —CH₂O(CH₂)$_n$CH₃,

—CH₂Cl, and —CH₂Br; n is an integer from 0 to 3;
M is an aromatic radical of one or more compounds selected from the group consisting of aromatic hydrocarbons, diaryl ethers, diaryl sulfides, diaryl amines, diaryl sulfones, diaryl ketones and diaryl diketones;
m is 1 to about 9;
Y is selected from the group consisting of —CH₂— and —CH₂OCH₂—; and
T is the same as R when Y is —CH₂— and is hydrogen when Y is —CH₂—O—CH₂—,
with diazonium salts having the structure:

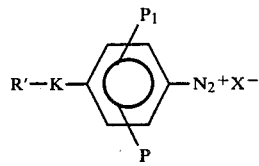

wherein:
R' is selected from the group consisting of phenyl, and C, to C₄ alkyl substituted phenyl K is selected from the group consisting of

—S—, —O—, and —CH₂—, or is absent;
P and P₁ are selected from the group consisting of C₁ to C₄ alkyl, methoxy, ethoxy, butoxy, and H;
P₁ may be the same as P or different; and
X is an anion.

Whereas recently developed, faster diazos offer many advantages in terms of speed and quality which render them extremely suitable in applications requiring low energy light exposure, including laser exposure applications, a major drawback is their decreased stability to heat. Whereas many of the less sensitive low molecular weight diazos exhibit a shelf life of weeks or months, under normal storage conditions, sensitized printing plates coated with the newer materials have a shelf life measured in hours, especially at higher storage temperatures.

Examples of prior art materials which are known diazo stabilizers in planographic printing plate applications include aryl and haloaryl sulfonic acids as taught in U.S. Pat. No. 2,649,373; phosphoric and sulfonic acids as taught in U.S. Pat. No. 3,679,419; benzophenone compounds as disclosed in U.S. Pat. No. 3,503,330; and diazo-borofluoride salts as taught in U.S. Pat. No. 3,933,499. U.S. Pat. No. 4,172,729 discloses a presensitized diazo lithographic plate having improved shelf life and printing performance containing up to 5% by weight of oxalic acid or a salt thereof as a stabilizer. The patent also comparatively recites the utilization of other additives such as citric, phosphoric, sulfonic, boric, sulfuric, polyphosphoric, adipic, sulfamic and tartaric acids as well as glycine and other acid salts.

Stabilizers have also been employed in two component light sensitive diazotype photographic compositions. These compositions are used in photographic processes where dyes are formed in-situ as the result of a coupling reaction between an undecomposed diazonium salt and a coupling component. The object of stabilization in these systems is to inhibit premature coupling of the diazonium salt and coupler during storage and prior to use. While the chemistry in such systems differs from the planographic systems disclosed herein, stabilizers similar to those employed in planographic systems have been suggested by the prior art.

Examples of such prior art stabilizers include aryl and haloaryl sulfonic acids and their salts as taught in U.S. Pat. No. 3,102,812; certain unsaturated organic acids such as crotonic, pentenic, sulfo cinnamic and derivatives of acrylic acid as taught in U.S. Pat. No. 2,354,088; certain anthranilic acids as taught in U.S. Pat. No. 2,496,240; certain acids such as tartaric, citric, boric, phosphoric and polyphosphoric such as taught in U.S. Pat. No. 3,615,574; certain acids including maleic, malonic, trichloroacetic, glyoxilic and sulfanilic as disclosed in U.S. Pat. No. 3,660,581; boric acid ester as disclosed in U.S. Pat. No. 3,679,421; certain organic acid amides, ketoacids, cyanoacids, cyclic acid derivatives, nitro acids and acetylenic acids as disclosed in U.S. Pat. No. 3,453,112; aromatic amines as disclosed U.S. Pat. No. 3,704,129; and saturated and unsaturated gamma lactones as disclosed in U.S. Pat. No. 2,374,563.

Whereas many of the aforementioned acid stabilizers might be considered suitable for the stabilization of any diazonium composition, it has been found that many of these acids affect the light sensitivity and speed of the diazonium composition. This is of particular disadvantage in the case of diazonium compound condensation products having the Formulas I through IV above since the enhancement of stability of such materials at the expense of speed and light sensitivity would render them of decreased utility in those applications where speed is of critical importance.

Accordingly, it is an object of this invention to provide light sensitive diazonium compound condensation product compositions having enhanced stability against heat and/or moisture and improved shelf life.

Another object is to provide light sensitive diazonium compound condensation product based photoresist materials and printing plates having enhanced stability and shelf life.

Another object is to impart increased shelf life to fast acting diazonium compound condensation product sensitized printing plates without a significant sacrifice of the speed of the diazo.

SUMMARY OF THE INVENTION

These and other objects of the invention have been achieved by the provision of light sensitive, water soluble diazonium compound condensation product compositions containing stabilizing amounts of one or more selected amino acids of the type hereinafter defined.

DETAILED DESCRIPTION OF THE INVENTION

Diazonium compound condensation products subject to stabilization in accordance with the present invention include those water soluble materials falling within the scope of the formula $A-N_2+X^-$ set forth above, including compositions of the specific Formulas I-IV. Specific materials include, but are not limited to, the product of condensation of p-diazo diphenyl amine sulfate and paraformaldehyde in sulfuric acid, isolated as the zinc chloride salt, also known as "Diazo Resin No. 4" available from Fairmount Chemical Corporation; the product of the condensation of 3-methoxy-diphenylamine-4-diazonium sulfate and 4,4'-bis-methoxy-methyl-diphenylether in phosphoric acid, isolated as the zinc chloride salt, as disclosed in U.S. Pat. No. 3,679,419; the product of the condensation of p-diazo diphenyl amine sulfate and paraformaldehyde in phosphoric acid, isolated as the zinc chloride salt; and the reaction product of a homocondensed oligomer such as based on a 4,4'-bis-alkoxy diphenyl ether condensed with a 3-alkoxy-4-diazo diphenyl amine sulfate in phosphoric acid, isolated as the zinc chloride salt.

Diazonium compound condensation products which are most advantageously stabilized in accordance with the teachings of the present invention are those extremely light sensitive water soluble materials exhibiting an absorbtivity of 45% or less when scanned in the range of 350 to 390 nanometers using a Perkin-Elmer UV visible spectrometer (Model #559) under standard test conditions. The diazonium compound condensation product is evaluated as a $1 \times 10^{-3}\%$ by weight solution in methyl cellosolve in a cuvette, blanked out against itself, at a slit of one nanometer and a range of 0-1. The stabilizers of the present invention not only serve to stabilize such fast water soluble acting diazonium compound condensation products, but do so without a serious sacrifice of speed or image quality.

The selected amino acids stabilizers within the scope of the present invention are alpha-aminosuccinamic acid (asparagine), alpha-aminopropionic acid (alanine), guanidine aminovaleric acid hydrochloride (arginine hydrochloride), amin-succinic acid (aspartic acid), citrulline, dihydroxyphenylalanine (dopa), alpha-aminoglutaric acid (glutamic acid), 2-amino-3-methylpentanoic acid (isoleucine), 2-amino-4-(methylthio) butyric acid (methionine), alpha-amino-beta-hydroxybutyric acid (threonine), and mixtures thereof.

The above referenced acids are categorized as "selected amino acids" for the purposes of this invention to distinguish them from other amino acids which were empirically evaluated and found not to offer any advantage in terms of stabilization, as set forth in Examples 11–25 of Table 1. The term should not however be construed to exclude an amino acid which has not been identified at the time of filing of this application and which should be subsequently found by those skilled in the art to give results in terms of diazonium stability and speed comparable to the favorable results provided by the selected amino acids of Examples 1–10 as set forth in Table 1. In general, the amino acids which impart at least a 2½ fold increase in the time in which degradation of a diazonium compound occurs at 100° C. under the test conditions set forth herein.

The relative proportions of diazonium compound condensation products and amino acid stabilizer required to provide effective stabilization will vary depending upon the identity of the water soluble diazonium compound condensation products and the particular amino acid. In general, from about 0.1 to about 2 parts by weight stabilizer per part by weight water soluble diazonium compound condensation product will prove satisfactory. Normally, from 0.25 to 1.0 part per part water soluble diazonium compound condensation product is sufficient.

The stabilized light sensitive diazonium compositions of this invention may be used in reproduction layers in the conventional way. They may be dissolved in the appropriate solvent in which they are soluble, e.g., water or a mixture of water and a water miscible organic solvent, and coated on supports and dried to form printing plates, color proofing foils, resists for printed circuitry and the like. Such supports include grained or anodized aluminum, transparent plastic sheets, paper, copper and the like.

The layer compositions may also include other additives known in the art such as pigments, dyes, polymer binders, plasticizers, sensitizers, wetting agents, indicators and the like. Representative conventional additives and polymer binders are set forth in more detail in U.S. Pat. No. 3,679,419.

All additives should be selected such that they are compatible with the water soluble diazonium compound condensation product, the stabilizer and polymeric binder, if any, employed in the formulation of the light sensitive layers, as well as the solvent employed in preparing the layer. Suitable solvents include water, water plus lower aliphatic alcohols, and water plus lower aliphatic ethers. Suitable polymer binders include materials soluble in water or alkaline soluble aqueous systems such as polyvinyl alcohol, polyacrylamides, copolymers of vinyl aromatic compounds with acidic comonomers such as maleic anhydride. Polymeric binders where employed, are generally used at a level of from about 1 to 50 parts by weight per part by weight of the water soluble diazonium compound condensation product.

The stabilized diazonium compositions of the present invention are most efficiently prepared by forming a solution of the diazonium compound condensation product and amino acid stabilizer in a solvent in which both materials are soluble. The solution may also include other additives dissolved or dispersed therein. The solution may be applied to the appropriate substrate by any known technique such as swabbing, whirl coating or simple wipe-on, followed by drying to drive off the solvent.

The following Examples are illustrative of the invention.

CONTROL A

A sensitized printing plate was prepared according to the following technique. A web of aluminum was mechanically roughened by surface graining to increase the surface area. The roughened plate was well rinsed and subsequently rendered hydrophilic by treatment with polyvinylphosphonic acid as taught in U.S. Pat. No. 4,153,461. The treated plate was well rinsed and then dried.

A section (20"×20") was whirl coated with a 0.2% by weight solution, in deionized water, of the product of the condensation of p-diazo diphenyl amine sulfate and paraformaldehyde, isolated as the zinc chloride double salt, which is designated as Diazo A. The plate was then dried.

CONTROL B

The control above was repeated except that in this case the diazonium compound employed was the reaction product of 4,4'-bis-methoxy-methyl diphenyl ether with 3 methoxy-4-diazo diphenyl amine sulfate, isolated as the methane sulfonate salt, which is designated Diazo B. This diazonium compound condensation product and analogous diazoniums are disclosed in U.S. Pat. No. 3,867,147.

The control plates prepared above were tested for speed and stability as follows. The plates were cut into a plurality of 5"×5" pieces and a first piece was exposed with a mercury vapor light source using a test flat having a 21 step Stauffer Step wedge, each increasing step representing a change in density equal to 2. The vacuum frame was equipped with a light integrated for precise and automatic shutter control. Exposure was made in units (1 unit=12 millijoules per cm$^2$) and each test plate was exposed for 2 units. The exposed plate sample was then developed with Western Jet Black Lacquer Developer manufactured by Western Litho. After development, the control plates were found to have clean hydrophilic background areas. The step wedge of the Control A plate was found to have 2 solid and 3 ghost steps, hence the designation ⅔. The Control B plate was found to have 4 solid and 2 ghost steps, hence the designation 4/2.

Heat stability of the plates was determined as follows. The unexposed 5" by 5" pieces of the Control plates were placed in an oven maintained at 100° C., for an accelerated aging test. One sample of each plate was removed every 5 minutes up to a total residence time of 60 minutes, and each plate was evaluated by the Step Wedge exposure technique as described above.

The change in step wedge relative to the control after aging is an indication of stability. An increase in the solid step and/or ghost step indicates an undesired degrading of the coating. A plate is considered lithographically unacceptable when the loss of hydrophilicity is such that all or a substantial portion of the plate surface scums when developed such that a step wedge reading can not be made.

Using the above technique, it was found that the Control A sample was completely degraded at 15 minutes residence time at 100° C., and the solid/ghost at 10 minutes had deteriorated to 5/4. In the case of the Control B sample, complete degradation took place at 10 minutes residence time and the solid/ghost at 5 minutes had deteriorated to 7/5. Each of these samples containing no stabilizer would be considered lithographically unacceptable based on a predictable early deterioration of the photosensitive plates under normal commercial conditions of shipping and storage.

EXAMPLES 1–10

In the same manner as described for Control A and Control B above, five different formulations were prepared by forming solutions in deionized water of the respective A and B diazonium compound condensation products at 0.2% by weight mixed with 0.2% by weight of each selected amino acid. The formulations were coated on aluminum plates, dried and tested as set forth above. Results for each of the selected amino acids tested are set forth in Table 1.

The numbers set forth under the time column in Table 1 represent the oven time at which the diazonium composition had degraded to the point where no differentiation in the various Step Wedge readings could be observed. The Step Wedge readings represent the readings obtained for the last acceptable plate sample removed from the oven 5 minutes previous to the removal of the unacceptable plate.

TABLE II-continued

| DIAZO A Concentration | Citrulline Concentration | minutes at 100° C. | Solid/Ghost Start - End | |
|---|---|---|---|---|
| 0.2% | 0.1% | 60+ | 3/3 | 3/3 |
| 0.2% | 0.02% | 60+ | 3/3 | 3/4 |
| 0.2% | 0.002% | 15 | 2/2 | 5/4 |

TABLE 1

| | DIAZO A | | | DIAZO B | | |
|---|---|---|---|---|---|---|
| | (minutes) | Solid/Ghost | | (minutes) | Solid/Ghost | |
| STABILIZER | Time at 100° C. | Start | End | Time at 100° C. | Start | End |
| Ex 1 asparagine | 50 | 3/4 | 5/4 | 45 | 5/3 | 6/6 |
| Ex 2 alanine | 35 | 2/3 | 4/5 | 30 | 4/2 | 5/5 |
| Ex 3 arginine HCl | 45 | 1/3 | 3/3 | 40 | 3/2 | 4/4 |
| Ex 4 aspartic acid | 45 | 3/4 | 4/4 | 35 | 5/3 | 6/4 |
| Ex 5 citrulline | 60+ | 3/3 | 3/3 | 60 | 5/5 | 5/4 |
| Ex 6 dopa | 55 | 3/3 | 4/3 | 45 | 5/2 | 6/2 |
| Ex 7 glutamic acid | 55 | 2/4 | 4/2 | 40 | 4/3 | 5/3 |
| Ex 8 isoleucine | 40 | 3/4 | 3/4 | 30 | 5/3 | 5/4 |
| Ex 9 methionine | 45 | 3/3 | 3/5 | 40 | 5/3 | 5/5 |
| Ex 10 threonine | 40 | 3/3 | 4/6 | 25 | 5/2 | 5/7 |
| Control | 15 | 2/3 | 5/4 | 10 | 4/2 | 7/5 |
| Ex 11 cystine | 5 | plate scummed after 5 min. | | 5 | plate scummed after 5 min. | |
| Ex 12 ethionine | 5 | plate scummed after 5 min. | | 5 | plate scummed after 5 min. | |
| Ex 13 histidine HCl | 5 | plate scummed after 5 min. | | 5 | plate scummed after 5 min. | |
| Ex 14 leucine | 5 | plate scummed after 5 min. | | 5 | plate scummed after 5 min. | |
| Ex 15 lysine dehydrchloride | 5 | plate scummed after 5 min. | | 5 | plate scummed after 5 min. | |
| Ex 16 norleucine | 5 | plate scummed after 5 min. | | 5 | plate scummed after 5 min. | |
| Ex 17 norvaline | 5 | plate scummed after 5 min. | | 5 | plate scummed after 5 min. | |
| Ex 18 ornithine | 5 | plate scummed after 5 min. | | 5 | plate scummed after 5 min. | |
| Ex 19 ornithine HCl | 5 | plate scummed after 5 min. | | 5 | plate scummed after 5 min. | |
| Ex 20 phenylalanine | 5 | plate scummed after 5 min. | | 5 | plate scummed after 5 min. | |
| Ex 21 proline | 5 | plate scummed after 5 min. | | 5 | plate scummed after 5 min. | |
| Ex 22 tryptophane | 5 | plate scummed after 5 min. | | 5 | plate scummed after 5 min. | |
| Ex 23 tyrosine | 5 | plate scummed after 5 min. | | 5 | plate scummed after 5 min. | |
| Ex 24 valine | 5 | plate scummed after 5 min. | | 5 | plate scummed after 5 min. | |
| Ex 25 alpha amino N butyric acid | 5 | plate scummed after 5 min. | | 5 | plate scummed after 5 min. | |

EXAMPLES 11-25

In a manner identical to that described in examples 1-10, other diazonium formulations were prepared using the same diazonium salts, but substituting amino acids which, for the purposes set forth herein, were found to be unacceptable in terms of imparting heat stability. Results for each amino acid tested are also set forth in Table 1.

As can be seen from an analysis of Table 1, the selected amino acids of Examples 1-5 all imparted an improvement in heat stability of the water soluble diazonium compound condensation product evaluated as compared with the controls. In contrast, the amino acids of examples 11-25 not only gave rise to no improvement in heat stability of the diazonium salt, but actually proved deliterious when compared with the control samples. All of these latter plates scummed after 5 minutes residence time at 100° C. and would be characterized as lithographically unacceptable.

EXAMPLE 26

Four solutions were prepared by dissolving 0.2% by weight of Control Diazo A in deionized water. Citrulline was added to each solution at various concentration levels. The four citrulline ratios relative to the Diazo were 2, 0.5, 0.1, and 0.01. The data and results are tabulated on Table II.

TABLE II

| DIAZO A Concentration | Citrulline Concentration | minutes at 100° C. | Solid/Ghost Start - End | |
|---|---|---|---|---|
| 0.2% | 0.4% | 60+ | 3/3 | 3/3 |

What we claim is:

1. A composition suitable for producing a light sensitive reproduction material, said reproduction material comprising a support and a reproduction layer thereon, which reproduction layer consists of said composition; said composition consisting of a light sensitive water soluble diazonium compound condensation product in admixture with an amino acid, said amino acid being present in an amount sufficient to substantially improve the heat stability of said diazonium compound condensation product, said amino acid imparts at least a 2½ fold increase in the time in which degradation of the diazonium compound occurs at 100° C.

2. The composition of claim 1 wherein said diazonium compound condensation product includes the generic structure $A-N_2^+X^-$ wherein A is an aromatic or heterocyclic residue and X is the anion of an acid which renders said diazonium compound condensation product water soluble.

3. The composition of claim 2 wherein said water soluble diazonium compound condensation product has the composition of Formula I, as set forth herein.

4. The composition of claim 2 wherein said water soluble diazonium compound condensation product has the composition of Formula II, set forth herein.

5. The composition of claim 2 wherein said water soluble diazonium compound condensation product has the composition of Formula III, set forth herein.

6. The composition of claim 1 wherein said water soluble diazonium compound condensation product has the composition of Formula IV, set forth herein.

7. The composition of claim 1 wherein said amino acid is selected from the group consisting of asparagine, alanine, arginine hydrochloride, aspartic acid, citrulline, dopa, glutamic acid, isoleucine, methionine, threonine and mixtures thereof.

8. The composition of claim 7 wherein said selected amino acid is selected from one or more of citrulline, asparagine, dopa and glutamic acid.

9. A composition suitable for producing a light sensitive reproduction material, said reproduction material comprising a support and a reproduction layer thereon, which reproduction layer consists of said composition; said composition consisting of a light sensitive water soluble diazonium compound condensation product in admixture with an amino acid, and one or more additives selected from the group consisting of solvents, dyes, polymer binders, plasticizers, sensitizers, wetting agents and indicators, said amino acid being present in an amount sufficient to substantially improve the heat stability of said diazonium compound condensation product, said amino acid imparts at least a 2½ fold increase in the time in which degradation of the diazonium compound occurs at 100° C.

10. A light sensitive reproduction material comprising a support and a reproduction layer thereon having the composition of claim 1.

11. A light sensitive reproduction material comprising a support and a reproduction layer thereon, said support comprising aluminum, and said reproduction layer comprising a light sensitive water soluble diazonium compound condensation product in admixture with an amino acid, said amino acid being present in an amount sufficient to substantially improve the heat stability of said diazonium compound condensation product, said amino acid imparts at least a 2½ fold increase in the time in which degradation of the diazonium compound occurs at 100° C.

12. The reproduction material of claim 11 wherein said diazonium compound condensation product has the composition of Formula IV, set forth herein.

13. The reproduction material of claim 11 wherein said reproduction layer further comprises one or more additives selected from the group consisting of pigments, dyes, solvents polymer binders, plasticizers, sensitizers, wetting agents and indicators.

14. The light sensitive reproduction material of claim 11 wherein said amino acid is selected from the group consisting of asparagine, alanine, arginine hydrochloride, aspartic acid, citrulline, dopa, glutamic acid, isoleucine, methionine, threonine and mixtures thereof.

* * * * *